United States Patent
Bhat et al.

(10) Patent No.: US 7,615,389 B2
(45) Date of Patent: Nov. 10, 2009

(54) GAN LASERS ON ALN SUBSTRATES AND METHODS OF FABRICATION

(75) Inventors: Rajaram Bhat, Painted Post, NY (US); Jerome Napierala, Painted Post, NY (US); Dmitry Sizov, Painted Post, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 310 days.

(21) Appl. No.: 11/893,188

(22) Filed: Aug. 15, 2007

(65) Prior Publication Data

US 2008/0299691 A1   Dec. 4, 2008

Related U.S. Application Data

(60) Provisional application No. 60/932,450, filed on May 31, 2007.

(51) Int. Cl.
*H01L 21/00*   (2006.01)
(52) U.S. Cl. ............. 438/31; 438/46; 438/47; 257/79; 257/103; 257/E21.028
(58) Field of Classification Search .......... 438/31, 438/22, 46, 47; 257/79, 103, E21.028
See application file for complete search history.

(56) References Cited

U.S. PATENT DOCUMENTS

| | | | | |
|---|---|---|---|---|
| 6,028,877 | A | 2/2000 | Kimura | 372/46 |
| 6,328,796 | B1 | 12/2001 | Kub et al. | 117/94 |
| 6,535,536 | B2 | 3/2003 | Fukunaga et al. | 372/45 |
| 6,815,241 | B2 | 11/2004 | Wang | 438/46 |
| 6,836,496 | B1 | 12/2004 | Kano et al. | 372/43 |
| 6,861,672 | B2 * | 3/2005 | Kamiyama et al. | 257/79 |
| 6,914,922 | B2 * | 7/2005 | Hayashi et al. | 372/45.01 |
| 7,015,053 | B2 * | 3/2006 | Kozaki et al. | 438/22 |
| 7,042,011 | B2 | 5/2006 | Takatani | 257/78 |
| 7,183,578 | B2 | 2/2007 | Akasaki et al. | 257/79 |
| 7,193,246 | B1 * | 3/2007 | Tanizawa et al. | 257/94 |
| 7,498,182 | B1 * | 3/2009 | Sampath et al. | 438/21 |
| 2002/0039374 | A1 | 4/2002 | Onomura et al. | 372/46 |
| 2003/0183827 | A1 | 10/2003 | Kawaguchi et al. | 257/79 |
| 2003/0206567 | A1 | 11/2003 | Takatani | 372/45 |
| 2005/0135471 | A1 | 6/2005 | Takantani | 372/45 |
| 2006/0203868 | A1 | 9/2006 | Hirata | 372/43.01 |
| 2007/0014325 | A1 | 1/2007 | Park et al. | 372/70 |

OTHER PUBLICATIONS

AlGaN-Cladding-Free Nonpolar InGaN/GaN Laser Diodes, Feezell, et al Japanese Journal of Applied Physics, vol. 46, No. 13, 2007, pp. L284-L286.

\* cited by examiner

*Primary Examiner*—Michael Trinh
(74) *Attorney, Agent, or Firm*—Kwadjo Adusei-Poku

(57) ABSTRACT

Ga(In)N-based laser structures and related methods of fabrication are proposed where Ga(In)N-based semiconductor laser structures are formed on AlN or GaN substrates in a manner that addresses the need to avoid undue tensile strain in the semiconductor structure. In accordance with one embodiment of the present invention, a Ga(In)N-based semiconductor laser is provided on an AlN or GaN substrate provided with an AlGaN lattice adjustment layer where the substrate, the lattice adjustment layer, the lower cladding region, the active waveguiding region, the upper cladding region, and the N and P type contact regions of the laser form a compositional continuum in the semiconductor laser. Additional embodiments are disclosed and claimed.

20 Claims, 1 Drawing Sheet

GAN LASERS ON ALN SUBSTRATES AND METHODS OF FABRICATION

CROSS REFERENCE TO RELATED APPLICATIONS

This application claims the benefit of U.S. Provisional Application Ser. No. 60/932,450, filed May 31, 2007.

BACKGROUND OF THE INVENTION

The present invention relates to Ga(In)N semiconductor lasers and, more particularly, to the design and fabrication of such semiconductor lasers.

SUMMARY OF THE INVENTION

Semiconductor lasers comprising active waveguiding regions formed from GaN and/or GaInN cover light emission from UV to red and are referred to herein collectively as Ga(In)N-based semiconductor lasers. The present inventors have recognized that although 405 nm Ga(In)N-based semiconductor lasers have been commercialized, there is a continuing drive to develop commercially feasible blue and green Ga(In)N-based semiconductor lasers. Accordingly, although the concepts of the present invention are not limited to the context of blue and green emission, one object of the present invention is to provide laser designs and fabrication procedures that improve the prospects for commercially feasible blue and green Ga(In)N-based semiconductor lasers.

GaN-based lasers often use aluminum gallium nitride (AlGaN) cladding layers but the refractive index contrast between AlGaN and GaN is relatively small, especially in the blue/green optical range. Accordingly, the present inventors have recognized that relatively high Al content in AlGaN is needed to increase the refractive index contrast and improve laser operation. The present inventors have also recognized that there is a practical limit to the Al content and/or layer thickness of AlGaN layers in semiconductor laser structures because these layers are often under tensile strain, which can lead to cracking or other structural defects.

According to the present invention, GaN laser structures and related methods of fabrication are proposed where Ga(In)N-based semiconductor laser structures are formed on AlN or GaN substrates in a manner that addresses the need to avoid undue tensile strain in the semiconductor structure. In accordance with one embodiment of the present invention, a Ga(In)N semiconductor laser is provided on an AlN or GaN substrate provided with an AlGaN lattice adjustment layer where the substrate, the lattice adjustment layer, the lower cladding region, the active waveguiding region, the upper cladding region, and the N and P type contact regions of the laser form a compositional continuum in the semiconductor laser.

In accordance with another embodiment of the present invention, the average Al content in the lattice adjustment layer is either (i) substantially equal to the Al content in the upper and lower cladding regions, (ii) sufficiently larger than the Al content in the upper and lower cladding regions to ensure that the upper and lower cladding regions assume a compressed or unstrained state when formed over the lattice adjustment layer; or (iii) less than the Al content of the upper and lower cladding regions such that the upper and lower cladding regions assume a tensile state when formed over the lattice adjustment layer but only to the extent that the resulting strain in the tensile state would not exceed a cracking threshold of the upper and lower cladding regions.

Additional embodiments, including methods of fabricating semiconductor lasers according to the present invention, are disclosed and will be appreciated from the following detailed description of the present invention and the appended claims.

BRIEF DESCRIPTION OF THE DRAWINGS

The following detailed description of specific embodiments of the present invention can be best understood when read in conjunction with the following drawing, where like structure is indicated with like reference numerals and in which.

DETAILED DESCRIPTION

Figure 1:
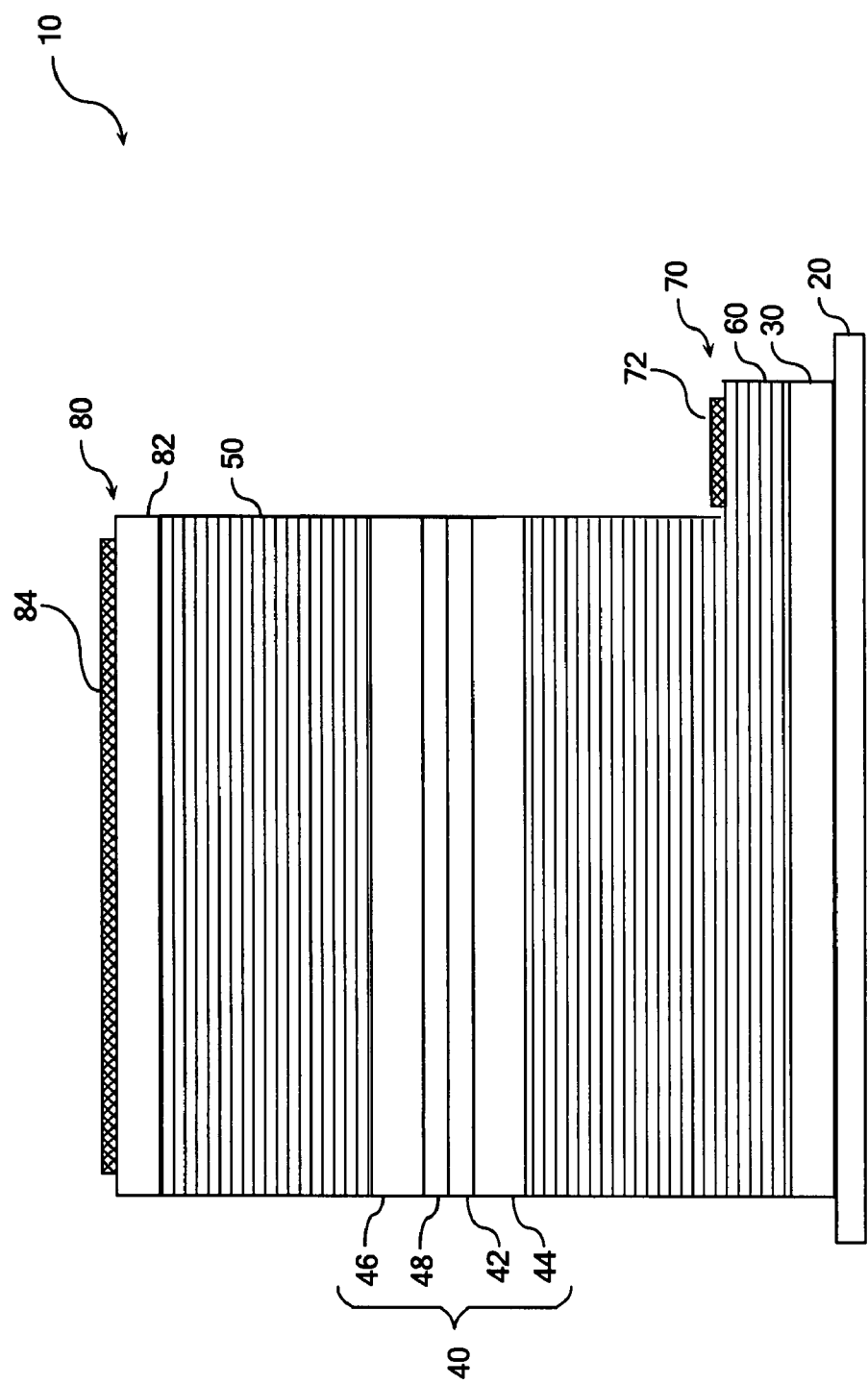
FIG. 1 is a general schematic illustration of a suitable semiconductor laser design according to a plurality of embodiments of the present invention.

Referring initially to FIG. 1, it is noted that various concepts of the present invention may be illustrated with reference to a semiconductor laser 10 configured as an edge-emitting laser diode, although the concepts of the present invention may be applied to a variety of semiconductor laser structures including, for example, edge emitting distributed Bragg reflector (DBR) lasers and vertical cavity surface emitting lasers (VCSEL). Generally, the semiconductor laser 10 comprises a substrate 20, a lattice adjustment layer 30, an active waveguiding region 40 interposed between an upper cladding region 50 and a lower cladding region 60, an N-type contact region 70, and a P-type contact region 80, each of which is described in further detail below. As will be appreciated by those familiar with semiconductor laser design, edge-emitting laser diodes employ upper and lower cladding regions 50, 60 to guide emission of coherent radiation toward a side edge of the laser stack. In contrast, a VCSEL is a type of semiconductor laser diode where a laser beam is emitted from the top surface of the laser stack and employs upper and lower Bragg reflectors in place of, or in combination with, the upper and lower cladding regions of the edge-emitting laser diode. A more detailed operational description of the manner in which the particular components of the edge-emitting and VCSEL configurations cooperate to generate laser light can be gleaned from readily available literature on the subject.

In the illustrated embodiment, the substrate 20 comprises AlN or GaN and the lattice adjustment layer 30 comprises AlGaN formed over the substrate 20. Although the lattice adjustment layer 30 can be non-conductive, in some embodiments it is contemplated that at least a portion of the AlGaN lattice adjustment layer 30 may comprise conductively doped AlGaN. Typically, the substrate 20 and the lattice adjustment layer 30 comprise substantially pure, i.e., at least about 99% pure, single crystal AlN, GaN or AlGaN. Although the lattice adjustment layer 30, which may also be readily obtained at purities at or above 95%, may be formed over the substrate in a variety of ways without departing from the scope of the present invention, it is noted that AlGaN layers can be grown on AlN or GaN substrates by first growing AlN or GaN and then grading to the desired composition of AlGaN. Growth in this manner is continued until the desired thickness is reached. Preferably, the thickness should be sufficient to ensure complete or almost complete relaxation of the AlGaN lattice adjustment layer 30. Alternatively, the lattice adjustment layer 30 comprising the desired composition of AlGaN can be grown directly on the AlN or GaN substrate 20 but it is anticipated that direct growth may yield a lattice adjustment layer 30 with a higher density of dislocations near its surface.

To complete fabrication of the semiconductor laser 10, the lower cladding region 60 is formed over the lattice adjustment layer 30 and comprises conductively doped AlGaN. The active waveguiding region 40 is formed over the lower cladding region 60 and comprises a Ga(In)N-based quantum well structure configured for laser light emission. The upper cladding region 50 is formed over the active waveguiding region 40 and comprises conductively doped AlGaN. The N and P type contact regions are conductively coupled across the active waveguiding region and comprise GaN or AlGaN. As is noted above, the present inventors have recognized a number of significant design considerations associated with the fabrication of Ga(In)N semiconductor laser structures on AlN or GaN substrates. Specifically, there is a practical limit to the Al content and/or layer thickness of AlGaN layers in Ga(In)N semiconductor laser structures because these layers are often under tensile strain, which can lead to cracking or other structural defects. These challenges can be at least partially addressed by providing semiconductor laser structures with respective Al contents that are tailored to eliminate or substantially reduce crack formation.

For example, where relatively high Al content AlGaN cladding layers, e.g., 10%-20% Al, are required to obtain high index contrast waveguides in the green wavelength range, the present inventors have recognized advantages attributable to choosing optimal Al contents in the AlGaN lattice adjustment layer 30 and the upper and lower cladding layers 50, 60. Specifically, where AlGaN is used in the fabrication of Ga(In)N-based semiconductor lasers on AlN or GaN substrates, the lattice constant of particular layers in the structure will be inversely proportional to its Al content. Layers with low Al content will have large lattice constants and will tend to induce tensile strain in any other associated layers in the structure with high Al content. Accordingly, in particular embodiments of the present invention, Ga(In)N-based semiconductor lasers are grown on AlN or GaN substrates by providing an AlGaN lattice adjustment layer with an Al content that is higher than that of the associated cladding layers. In this manner, one can prevent cracking of the layers subsequently formed over the lattice adjustment layer 30 by ensuring that the semiconductor structure is either unstrained or in compression, because unstrained layers or layers under compression are less susceptible to cracking than layers under tensile strain. Alternatively, it is contemplated that Ga(In)N-based semiconductor lasers can be grown on AlN or GaN substrates by providing an AlGaN lattice adjustment layer with an Al content that is slightly lower than that of the associated cladding layers, provided the resulting tensile stress is small enough to avoid cracking.

More specifically, the Al content of the lattice adjustment layer 30 can be expressed as $Al_wGa_{1-w}N$, the Al content of the lower cladding region 60 can be expressed as $Al_vGa_{1-v}N$, and the Al content of the upper cladding region 50 can be expressed as $Al_uGa_{1-u}N$, where v<1 and u<1, respectively. Within this frame of reference, the respective values of u, v, and w can be established or controlled such that the Al content in the lattice adjustment layer 30 is either (i) sufficiently larger than the Al content in the upper and lower cladding regions 50, 60 to ensure that the upper and lower cladding regions 50, 60 assume a compressed or unstrained state when formed over the lattice adjustment layer 30 or (ii) less than the Al content of the upper and lower cladding regions 50, 60 such that the upper and lower cladding regions 50, 60 assume a tensile state when formed over the lattice adjustment layer 30 but only to the extent that the resulting strain in the tensile state would not exceed a cracking threshold of the upper and lower cladding regions 50, 60. Generally, the Al content is at least partially dictated by the index contrast that is desired between Ga(In)N and AlGaN at the operating wavelength of the laser. For example, in particular embodiments of the present invention requiring relatively high index contrast, the present inventors have recognized that, for Ga(In)N-based semiconductor lasers formed on AlN or GaN substrates, the respective values of u, v and w are greater than or equal to about 0.08. In addition, it may be preferable to ensure that one or both of the following conditions are met for the respective values of u, v and w: w>v−0.06, and w>u−0.06.

The thickness of the lattice adjustment layer 30 should preferably be sufficient to ensure that its lattice assumes a relaxed state after formation on the substrate 20, i.e., on the order of about 1 μm. For example, and not by way of limitation, it is contemplated that suitable semiconductor lasers can be fabricated on an AlN substrate by using a thick AlGaN buffer layer to support the growth of crack-free $Al_xGa_{1-x}N$/GaN DBR for the fabrication of Ga(In)N-based VSCELs. Although the illustrated embodiments show the lattice adjustment layer 30 formed directly on the AlN substrate 20, it is also contemplated that one or more intervening layers may be provided between the substrate and the lattice adjustment layer 30, in which case the lattice adjustment layer 30 would merely be formed "over" the AlN substrate 20. Similarly, although the lower cladding region 60 is formed directly on the lattice adjustment layer 30, it is also contemplated that one or more intervening layers may be provided between the lattice adjustment layer 30 and the lower cladding layer 60, in which case the lower cladding layer 60 would merely be formed "over" the lattice adjustment layer 30. The same can be said for other layers or regions recited herein as merely being formed "over" and associated layer or region.

The substrate 20, the lattice adjustment layer 30, the lower cladding region 60, the active waveguiding region 40, the upper cladding region 50, and the N and P type contact regions 70, 80 form what is defined herein as a "compositional continuum" in the semiconductor laser. More specifically, for the purposes of describing and defining the present invention, it is noted that a set of layers in a structure form a "compositional continuum" when at least one component of one layer in the structure can be found in the next recited layer in the structure. A "dual component compositional continuum" exists when two or more components of one layer in the structure can be found in the next recited layer in the structure. Emphasis is placed on "recited" layers in the structure because it is contemplated that a "compositional continuum," as defined herein, does not necessarily apply to layers that are not recited as part of the set of layers that form the compositional continuum. For example, referring to FIG. 1, where the substrate 20, the lattice adjustment layer 30, the lower cladding region 60, the active waveguiding region 40, the upper cladding region 50, and the N and P type contact regions 70, 80 form a compositional continuum, it is contemplated that the semiconductor laser may comprise intervening layers of any type that do not satisfy the conditions of the compositional continuum.

In particular embodiments of the present invention, the substrate 20, the lattice adjustment layer 30, the lower cladding region 60, the active waveguiding region 40, the upper cladding region 50, and the N and P type contact regions 70 form a dual component compositional continuum comprising components selected from Al, Ga, and N. More specifically, the compositional continuum transitions from an Al-based or Ga-based continuum at an interface of the AlN or GaN substrate 20 and the AlGaN lattice adjustment layer 30, to a dual component continuum of Al and Ga at an interface of the AlGaN lattice adjustment layer 30 and the AlGaN lower cladding region 60, to a Ga-based continuum at an interface of the AlGaN lower cladding region 60 and the Ga(In)N-based active waveguiding region 40. In addition, the aforementioned compositional continuum further comprises a Ga-based continuum across the Ga(In)N-based active waveguiding region 40 and the AlGaN upper cladding region 50.

Although the concepts of the present invention are not typically limited to particular active waveguiding region configurations, for the purposes of illustration, one suitable active waveguiding region configuration is presented in additional detail in FIG. 1. For example, and not by way of limitation, the active waveguiding region 40 may comprise a quantum well gain region 42 interposed between opposing waveguide layers 44, 46 and an electron blocking layer 48. The quantum well gain region 42 may comprise one or more quantum wells configured as one or more multiple quantum well layers, one or more multiple quantum dot layers, or combinations thereof and can be configured for emission of light at wavelengths below 550 nm. According to one embodiment of the present invention, the quantum well gain region 42 comprises GaN/GaInN, GaInN/GaInN, or AlGaN/GaInN multiple quantum wells or quantum dots and the opposing waveguide layers comprise GaN or GaInN of opposing N-type and P-type conductivity. It is also contemplated that the quantum well gain region could comprise GaInN/GaInN with higher levels of indium in the well than in the associated barrier. It is further contemplated that AlGaInN may be suitable for use in the quantum well gain region 42 and the associated waveguide layers 44, 46. Preferably, the quantum well gain region comprises $Ga_{1-y}In_yN$ or $Al_xGa_{1-x-y}In_yN$, where x is at least approximately 0 and y is at least approximately 0.05. Further, the electron blocking layer 48 comprises P-type AlGaN. It is contemplated that additional active waveguiding region configurations will also be suitable for adaptation in accordance with the teachings of the present invention.

Similarly, although the concepts of the present invention are not typically limited to particular cladding and contact region configurations, it is contemplated that the upper cladding region 50, which is formed over the active waveguiding region 40, may comprise a P-type AlGaN/GaN superlattice cladding while the lower cladding region 60 comprises N-type AlGaN. The N-type contact region 70 is illustrated generally in FIG. 1 and may be formed by the N-type lower cladding region 60 and an electrically conductive contact 72 interfaced with the lower cladding region 60 in the manner illustrated in FIG. 1. In addition, it is contemplated that all or part of the lower waveguide layer 44 and any associated barriers or wells may also be doped N-type to form the lower contact region 70. Similarly, the P-type contact region 80 is illustrated generally in FIG. 1 and may comprises a P-type GaN layer 82 formed over the upper cladding region 50 and an electrically conductive contact 84 interfaced with the P-type GaN layer.

Further, although the concepts of the present invention are described herein with primary reference to electrically pumped laser structures, it is contemplated that the various advantages of the present invention can also be employed in the context of optically pumped lasers, in which case the upper and lower cladding regions 50, 60 would not need to be conductively doped.

It is noted that references herein to a Ga(In)N-based active waveguiding region or a Ga(In)N-based semiconductor laser should be read broadly to cover any semiconductor laser where the active waveguiding region of the semiconductor laser comprises a quantum well structure formed at least in part by GaN or GaInN.

In addition, recitations herein of a component of the present invention being "configured" in a particular way or to embody a particular property or function, are structural recitations as opposed to recitations of intended use. For example, references herein to a Ga(In)N laser being "configured" as a VCSEL or DBR edge-emitting laser denotes an existing physical condition of the laser and, as such, is to be taken as a definite recitation of the structural characteristics of the laser.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present invention or to emphasize alternative or additional features that may or may not be utilized in a particular embodiment of the present invention.

For the purposes of describing and defining the present invention it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents. For example, although some aspects of the present invention are identified herein as preferred or particularly advantageous, it is contemplated that the present invention is not necessarily limited to these preferred aspects of the invention.

What is claimed is:

1. A method of fabricating a semiconductor laser comprising a substrate, a lattice adjustment layer, an active waveguiding region interposed between an upper cladding region and a lower cladding region, an N-type contact region, and a P-type contact region, wherein the method comprises:

providing a substrate comprising AlN or GaN;

forming a lattice adjustment layer comprising $Al_wGa_{1-w}N$ over the substrate, where w<1;

forming a lower cladding region comprising $Al_vGa_{1-v}N$ over the lattice adjustment layer, where v<1;

forming a Ga(In)N-based active waveguiding region over the lower cladding region and configuring the Ga(In)N-based active waveguiding region for laser light emission;

forming an upper cladding region comprising $Al_uGa_{1-u}N$ over the active waveguiding region, where u<1;

conductively coupling N and P type contact regions comprising GaN or AlGaN across the active waveguiding region; and controlling the aluminum content coefficients u, v, and w such that the Al content in the lattice adjustment layer is (i) sufficiently larger than the Al content in the upper and lower cladding regions to ensure that the upper and lower cladding regions assume a compressed or unstrained state when formed over the lattice adjustment layer or (ii) less than the Al content of the upper and lower cladding regions such that the upper and lower cladding regions assume a tensile state when formed over the lattice adjustment layer but only to the extent that the resulting strain in the tensile state would not exceed a cracking threshold of the upper and lower cladding regions.

2. A method of fabricating a semiconductor laser as claimed in claim 1 wherein the respective values of u, v and w are greater than or approximately equal to 0.08.

3. A method of fabricating a semiconductor laser as claimed in claim 1 wherein the respective values of u, v and w are such that w>v−0.06, and w>u−0.06.

4. A method of fabricating a semiconductor laser as claimed in claim 1 wherein the Al content in the lattice adjustment layer is sufficiently larger than the Al content in the upper and lower cladding regions to ensure that the upper and lower cladding regions assume a compressed or unstrained state when formed over the lattice adjustment layer.

5. A method of fabricating a semiconductor laser as claimed in claim 1 wherein the Al content in the lattice adjustment layer is less than the Al content of the upper and lower cladding regions such that the upper and lower cladding regions assume a tensile state when formed over the lattice adjustment layer but only to the extent that the resulting strain in the tensile state would not exceed a cracking threshold of the upper and lower cladding regions.

6. A method of fabricating a semiconductor laser as claimed in claim 1 wherein the active waveguiding region comprises a quantum well gain region interposed between opposing waveguide layers.

7. A method of fabricating a semiconductor laser as claimed in claim 6 wherein the quantum well gain region comprises $Ga_{1-y}In_yN$ or $Al_xGa_{1-x-y}In_yN$ where x is at least approximately 0 and y is at least approximately 0.05.

8. A method of fabricating a semiconductor laser as claimed in claim 6 wherein the quantum well gain region comprises GaInN and the opposing waveguide layers comprise GaN or GaInN of opposing N-type and P-type conductivity.

9. A method of fabricating a semiconductor laser as claimed in claim 6 wherein the quantum well gain region is configured for lasing emission at wavelengths longer that 440 nm.

10. A method of fabricating a semiconductor laser as claimed in claim 6 wherein the quantum well gain region is configured for lasing emission at wavelengths in the green and blue portions of the optical spectrum.

11. A method of fabricating a semiconductor laser as claimed in claim 1 wherein the substrate, the lattice adjustment layer, the lower cladding region, the active waveguiding region, the upper cladding region, and the N and P type contact regions form a compositional continuum in the semiconductor laser.

12. A method of fabricating a semiconductor laser as claimed in claim 1 wherein components forming the compositional continuum are selected from Al and Ga.

13. A method of fabricating a semiconductor laser as claimed in claim 1 wherein the compositional continuum transitions from an Al-based or Ga-based continuum at an interface of the substrate and the lattice adjustment layer, to a dual component continuum of Al and Ga at an interface of the lattice adjustment layer and the lower cladding region, to a Ga-based continuum at an interface of the lower cladding region and the active waveguiding region.

14. A method of fabricating a semiconductor laser as claimed in claim 13 wherein the compositional continuum further comprises a Ga-based continuum across the active waveguiding region and the upper cladding region.

15. A method of fabricating a semiconductor laser as claimed in claim 1 wherein the AlGaN lattice adjustment layer is non-conductive or at least a portion of the AlGaN lattice adjustment layer comprises conductively doped AlGaN.

16. A method of fabricating a semiconductor laser as claimed in claim 1 wherein the lattice adjustment layer is formed directly on the AlN or GaN substrate and the lower cladding region is formed directly on the lattice adjustment layer.

17. A method of fabricating a semiconductor laser as claimed in claim 1 wherein the AlN or GaN substrate is a substantially pure, single crystal AlN or GaN substrate and the lattice adjustment layer is substantially pure, single crystal AlGaN.

18. A method of fabricating a semiconductor laser comprising a substrate, a lattice adjustment layer, an active waveguiding region interposed between an upper cladding region and a lower cladding region, an N-type contact region, and a P-type contact region, wherein the method comprises:
   providing a substrate comprising AlN or GaN;
   forming a lattice adjustment layer comprising $Al_wGa_{1-w}N$ over the substrate, where w<1;
   forming a lower cladding region comprising $Al_vGa_{1-v}N$ over the lattice adjustment layer, where v<1;
   forming Ga(In)N-based active waveguiding region over the lower cladding region and configuring the Ga(In)N-based active waveguiding region for laser light emission;
   forming an upper cladding region comprising $Al_uGa_{1-u}N$ over the active waveguiding region, where u<1;
   conductively coupling N and P type contact regions comprising GaN or AlGaN across the active waveguiding region; and
   controlling the aluminum content coefficients u, v, and w such that the respective values of u, v and w are greater than or equal to approximately 0.08, and such that w>v−0.06 and w>u−0.06.

19. A semiconductor laser comprising a substrate, a lattice adjustment layer, a Ga(In)N-based active waveguiding region interposed between an upper cladding region and a lower cladding region, an N-type contact region, and a P-type contact region, wherein:
   the substrate comprises AlN or GaN;
   the lattice adjustment layer is formed over the substrate and comprises AlGaN;
   the lower cladding region is formed over the lattice adjustment layer and comprises AlGaN;
   the active waveguiding region is formed over the lower cladding region and is configured for laser light emission;
   the N and P type contact regions are conductively coupled across the active waveguiding region and comprise GaN or AlGaN; and
   the Al content of the lattice adjustment layer can be expressed as $Al_wGa_{1-w}N$, where w<1;
   the Al content of the lower cladding region can be expressed as $Al_vGa_{1-v}N$, where v<1; and
   the respective values of v and w are such that the Al content in the lattice adjustment layer is (i) sufficiently larger than the Al content in the lower cladding region to ensure that the lower cladding region assumes a compressed or unstrained state when formed over the lattice adjustment layer or (ii) less than the Al content of the lower cladding region such that the lower cladding region assumes a tensile state when formed over the lattice adjustment layer but only to the extent that the resulting strain in the tensile state would not exceed a cracking threshold of the lower cladding region.

20. A semiconductor laser as claimed in claim 19 wherein:

the upper cladding region is formed over the active waveguiding region and comprises conductively doped AlGaN;

the Al content of the upper cladding region can be expressed as $Al_u Ga_{1-u}N$, where $u<1$; and the respective values of u and w are such that the Al content in the lattice adjustment layer is (i) sufficiently larger than the Al content in the upper cladding region to ensure that the upper cladding region assumes a compressed or unstrained state when formed over the lattice adjustment layer or (ii) less than the Al content of the upper cladding region such that the upper cladding region assumes a tensile state when formed over the lattice adjustment layer but only to the extent that the resulting strain in the tensile state would not exceed a cracking threshold of the upper cladding region.

\* \* \* \* \*